(12) United States Patent
Kelley et al.

(10) Patent No.: US 9,392,734 B1
(45) Date of Patent: Jul. 12, 2016

(54) SECURITY WRAPPER FOR AN ELECTRONIC ASSEMBLY AND METHODS FOR FORMING SUCH A WRAPPER

(71) Applicant: LOCKHEED MARTIN CORPORATION, Bethesda, MD (US)

(72) Inventors: Matthew William Kelley, Orlando, FL (US); David Patrick Summerlot, Orlando, FL (US); Joseph Michael Turchiano, Orlando, FL (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 14/177,511

(22) Filed: Feb. 11, 2014

(51) Int. Cl.
| H05K 7/20 | (2006.01) |
| H05K 9/00 | (2006.01) |
| H05K 3/46 | (2006.01) |
| G06K 19/073 | (2006.01) |

(52) U.S. Cl.
CPC .............. *H05K 9/00* (2013.01); *G06K 19/073* (2013.01); *H05K 3/46* (2013.01); *H05K 7/2039* (2013.01)

(58) Field of Classification Search
CPC ................. G06K 19/073; G06K 19/07372
USPC ........................................................ 174/524
See application file for complete search history.

(56) References Cited

U.S. PATENT DOCUMENTS

| 5,539,379 A | 7/1996 | MacPherson |
| 5,858,500 A | 1/1999 | MacPherson |
| 6,970,360 B2 * | 11/2005 | Sinha ............................. 361/752 |
| 7,007,171 B1 | 2/2006 | Butturini et al. |
| 7,679,921 B2 | 3/2010 | Cesana et al. |
| 7,760,086 B2 | 7/2010 | Hunter et al. |
| 7,978,070 B2 | 7/2011 | Hunter |
| 8,110,472 B2 | 2/2012 | Herbert et al. |
| 8,127,151 B2 | 2/2012 | Nelson et al. |
| 8,399,781 B1 | 3/2013 | Pham et al. |

(Continued)

OTHER PUBLICATIONS

"GORE™ Secure Encapsulated Module", W. L. Gore & Associates, Inc. © 2007.

(Continued)

*Primary Examiner* — Hung V Ngo
(74) *Attorney, Agent, or Firm* — Terry M. Sanks, Esq.; Beusse Wolter Sanks & Maire, PLLC

(57) ABSTRACT

A security wrapper for an electronic assembly and methods for forming such a wrapper are provided. A first wrap layer and/or a second wrap layer may be made from a curable adhesive material. A flexible layer is interposed between the first and second wrap layers, which in combination constitute a pre-formed wrapper in an uncured condition. The pre-formed wrapper may be mounted onto an electronic assembly including circuit components having respective three-dimensional profiles which can vary over a surface of the electronic assembly. The pre-formed wrapper may be subjected to a curing process so that in a cured condition conformable adherence is provided with respect to the circuit components. This arrangement provides a thermal coupling effective to dissipate heat produced by such circuit components and further results in a low-profile for the assembly of the wrapper and electronic assembly.

18 Claims, 6 Drawing Sheets

(56) References Cited

U.S. PATENT DOCUMENTS

| | | |
|---|---|---|
| 2002/0084090 A1 | 7/2002 | Farquhar et al. |
| 2004/0222014 A1* | 11/2004 | Heffner .......................... 174/250 |
| 2008/0284610 A1 | 11/2008 | Hunter |
| 2009/0047797 A1* | 2/2009 | Anderson et al. ............. 438/763 |
| 2011/0090658 A1 | 4/2011 | Adams et al. |
| 2011/0120764 A1 | 5/2011 | Kelley et al. |
| 2012/0091456 A1 | 4/2012 | Kelley et al. |
| 2012/0205801 A1 | 8/2012 | Bindrup et al. |

OTHER PUBLICATIONS

"GORE™ Secure Plug-On Module", W. L. Gore & Associates, Inc. © 2007.

"GORE™ Secure PCMCIA Card", W. L. Gore & Associates, Inc. © 2007.

\* cited by examiner

SECURITY WRAPPER FOR AN ELECTRONIC ASSEMBLY AND METHODS FOR FORMING SUCH A WRAPPER

BACKGROUND

Embodiments relate generally to protection of intellectual property contained within electronic assemblies and, more particularly, to a security wrapper for an electronic assembly and methods for forming such a security wrapper.

In many applications, it is desirable to protect circuit components that are disposed on electronic assemblies, such as circuit boards, integrated circuits, etc., from unlawful or unauthorized access. One of the shortcomings of known protective devices has been that such devices generally do not provide appropriate thermal management of heat produced by the circuit components disposed on such electronic assemblies. Disclosed embodiments are believed to successfully address at least such shortcomings.

SUMMARY

Disclosed embodiments relate to a security wrapper for an electronic assembly and methodology for forming such a wrapper. One disclosed method comprises pre-forming a first wrap layer and a second wrap layer. At least one of the first and second wrap layers comprises a curable adhesive material. The method further comprises interposing a flexible layer between the first and second wrap layers, which in combination constitute a pre-formed wrapper in an uncured condition. The flexible layer includes one or more electrically-conductive traces. The pre-formed wrapper may then be mounted onto an electronic assembly including one or more circuit components having respective three-dimensional profiles which can vary over at least one surface of the electronic assembly. The pre-formed wrapper may then be subjected to a curing process under a predefined excitation modality so that in a cured condition at least one of the first and second wrap layers conformably adhering with respect to one or more circuit components, notwithstanding of variation in the respective three-dimensional profiles of such circuit components. The conformably adhering effects a thermal coupling between at least one of the first and second wrap layers and the circuit components effective to dissipate heat produced by such circuit components.

Another disclosed method comprises pre-forming a first wrap layer and a second wrap layer. At least one of the first and second wrap layers comprises a curable adhesive material. The method further comprises interposing a flexible layer between the first and second wrap layers, which in combination constitute a pre-formed wrapper in an uncured condition. The flexible layer includes one or more electrically-conductive traces. The pre-formed wrapper in the uncured condition may be transferred to a remote location for processing of the pre-formed wrapper at the remote location effective to form a security wrapper assembled onto an electronic assembly.

A disclosed security wrapper for an electronic assembly comprises a first wrap layer and a second wrap layer, where at least one of the first and second wrap layers comprises a curable adhesive material. A flexible layer is interposed between the first and second wrap layers. The flexible layer includes one or more electrically-conductive traces. At least one of the first and second wrap layers is structurally arranged to provide in a cured condition conformable adherence with respect to one or more circuit components disposed in an electronic assembly. The conformable adherence provided by at least one of the first and second wrap layers effects a thermal coupling with the circuit components effective to dissipate heat produced by such circuit components.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which:

FIG. 10 is a top view illustrating further details in connection with a security wrapper including the thermal pass-through.

DETAILED DESCRIPTION

Figure 1:
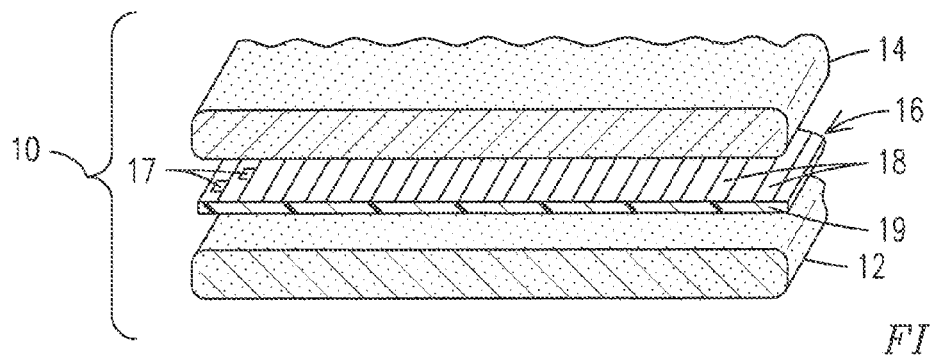
FIGS. 1-4 depict a flow sequence of non-limiting example operations in connection with one disclosed method for forming a security wrapper for an electronic assembly.

The present inventors have recognized certain limitations in connection with known devices for protecting electronic assemblies from unlawful or unauthorized access. It is believed that these limitations have hindered effective utilization of such devices where, for example, certain basic challenges still need to be appropriately met. Examples of such challenges may be enhanced operational reliability, efficient use of a limited space in connection with a given electronic assembly, and/or efficient thermal management of heat produced by circuit components disposed on such electronic assemblies.

At least in view of recognition of such limitations, the present inventors propose innovative methodology for forming a security wrapper for protecting an electronic assembly. In one non-limiting example, wrap layers that may be structural elements in a disclosed security wrapper may be processed to provide conformable adherence with respect to such circuit components. This structural arrangement provides a thermal coupling effective to dissipate heat produced by such circuit components. Without limitation, example circuit components that may be protected, such as from unlawful or unauthorized access, by disclosed embodiments may be microprocessors or microcomputers, memory devices, logic and control devices, input/output processing devices (as may include cryptographic processors, communication devices and processing elements), data buses and interconnect wiring between the circuit components.

In the following detailed description, various specific details are set forth in order to provide a thorough understanding of depicted embodiments. However, those skilled in the art will understand that such embodiments may be practiced without these specific details that the depicted embodiments are non-limiting embodiments, and that alternative embodiments may be implemented. In other instances, methods, procedures, and components, which would be well-understood by one skilled in the art have not been described in detail to avoid unnecessary and burdensome explanation. Embodiments are described herein with reference to the attached drawing where like reference numerals may be used throughout the figures to designate similar or equivalent elements. The figures are not drawn to scale and they are provided merely to illustrate and/or conceptualize aspects disclosed herein.

Furthermore, various operations may be described as multiple discrete steps performed in a manner that is helpful for understanding embodiments. However, the order of description should not be construed as to imply that these operations need to be performed in the order they are presented, nor that they are even order dependent unless otherwise so described. Moreover, repeated usage of the phrase "in one embodiment" does not necessarily refer to the same embodiment, although it may. Moreover, unless specifically stated, any use of the terms first, second, etc., does not denote any order or importance, but rather the terms first, second, etc., are used to distinguish one element from another. Lastly, the terms "comprising," "including," "having," and the like, as used in the present application, are intended to be synonymous unless otherwise so indicated.

Figure 14:
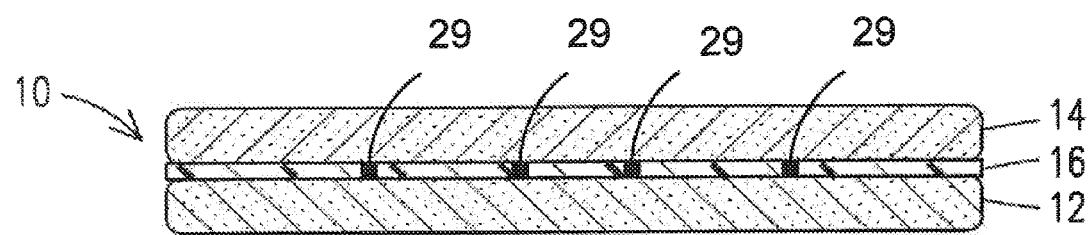
FIG. 14 illustrates a pre-formed wrapper in an uncured condition with holes or perforations.

FIGS. 1-4 depict a flow sequence of non-limiting steps or actions in connection with one disclosed methodology for forming a security wrapper for an electronic assembly. FIG. 1 illustrates a pre-formed wrapper 10 in an uncured condition. In one non-limiting embodiment, pre-formed wrapper 10 may comprise a first wrap layer 12 and a second wrap layer 14, where at least one of the first and second wrap layers 12, 14 (e.g., first layer 12) may comprise a curable adhesive material. First and second wrap layers 12, 14 may have been appropriately pre-formed or configured, such as to be appropriately compatible with the layout and/or geometric configuration of a given electronic assembly. In one non-limiting embodiment, the other wrap layer (e.g., second layer 14) may comprise a thermal interface material, a gap filler material or a curable adhesive material. In a non-limiting example, an adhesive second layer 14 may be used as a means of bonding a lid in embodiments where such a lid may be utilized as part of the electronic assembly. Non-limiting examples of adhesives from which first and/or second wrap layers 12, 14 may be made may include a thermoplastic adhesive, a thermoset adhesive, a B-stage adhesive, a phenolic adhesive, an epoxy, etc. A flexible layer 16 is interposed between first and second wrap layers 12, 14. Flexible layer 16 includes a plurality of electrically-conductive traces 18 disposed on a suitable film 19, such as a polymer film or substrate or a thin, flexible foil. Non-limiting examples of materials for electrically-conductive traces 18 may be metallized traces, carbon nanotubes, conductive polymers, traces composed of indium tin oxide, electrically-conductive inorganic material, metal-filled inks and electrically-conductive epoxies, etc. In certain embodiments, flexible layer 16 may include holes or perforations 29 shown in FIG. 14 to allow for improved cohesion between first and second wrap layers 12, 14. That is, arranged to increase cohesion between first and second wrap layers 12, 14.

For purposes of simplicity of explanation as well as avoiding visual cluttering in the drawings, the foregoing embodiment is described in the context of one flexible layer interposed between a pair of wrap layers; it will be appreciated, however, that non-limiting embodiments of a security wrapper may comprise a stacking arrangement of such layers (e.g., wrap layer, flexible layer, wrap layer, flexible layer, wrap layer, etc.). Depending on the needs of a given application, the electrically-conductive traces in respective stacks of flexible layers could be electrically independent of each other or could be electrically interconnected by way of electrically-conductive paths constructed through the stacked layers. It is further contemplated that the flexible layer itself may comprise a multi-layered arrangement, as would be appreciated by one skilled in the art of flexible circuit boards. It will be appreciated that depending on the needs of a given application one or more flexible circuit components 17, such as passive and/or active circuit components, may be optionally integrated in flexible layer 16.

Figure 2:
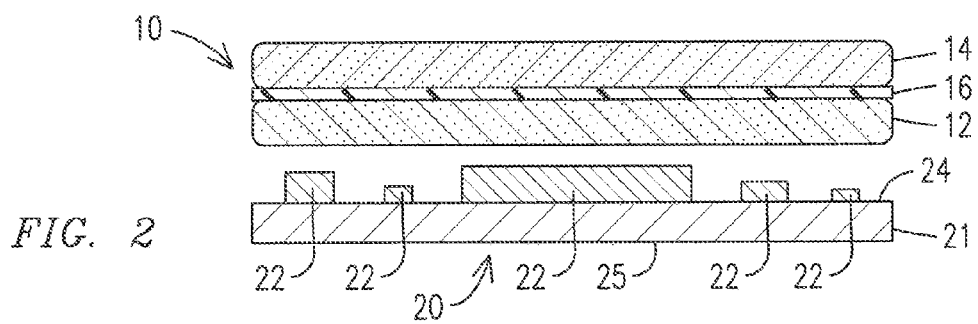

FIG. 2 illustrates the pre-formed wrapper 10 about to be mounted onto at least a portion of an electronic assembly 20, such as may comprise a circuit board 21, including one or more circuit components 22, which can have respective three-dimensional profiles which may vary over at least one surface 24 of circuit board 21. It will be appreciated that further circuit components (not shown) could additionally be disposed on a bottom surface 25 of circuit board 21, in which case the pre-formed wrapper 10 may be configured to be folded over any such circuit components disposed on such bottom surface.

It will be appreciated that electronic assembly 20 may comprise further circuit boards or structures for receiving the circuit components. As a non-limiting example, a plate 26 (FIG. 3) that in certain embodiments may function as a lid, in certain embodiments could additionally be used to receive at least some of the circuit components. It will be further appreciated that the geometry of an electronic assembly that can be protected by disclosed security wrappers is not limited to the example geometry illustrated in the drawings since the geometry of disclosed security wrappers may be tailored to accommodate the specific geometric configuration of a given electronic assembly. As would be appreciated by one skilled in the art, electrically-conductive traces 18 are used to provide respective electrical connections to the circuit components 22 in electronic assembly 20, such as may be implemented by way of one or more connectors (e.g., flexible printed circuit (FPC) connectors), or other interconnect devices.

Figure 3:
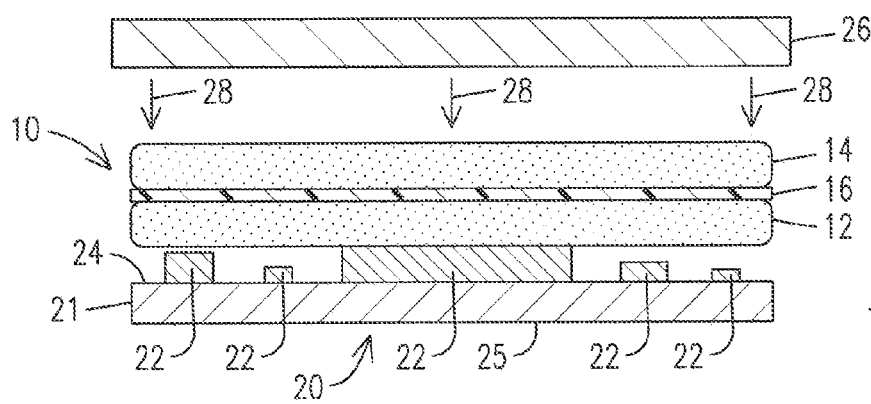

FIG. 3 may be used for conceptualizing a process stage where a curing action may be performed for curing the pre-formed wrapper 10 while mounted onto electronic assembly 20. As will be appreciated by those skilled in the art, this stage may involve application of an excitation modality to effect a curing reaction or simply curing (e.g., cross-linking) in layers comprising a curable material, such as first and/or second wrap layers 12, 14. It will be further appreciated that the specific excitation modality can vary depending on the specific material being used for such layers. Non-limiting examples of curing-excitation modalities may be thermal irradiance, electron-beam or gamma irradiance, microwave irradiance, reaction to moisture, pressure in combination with any of the foregoing excitation modalities, room-temperature curing, etc.

In the non-limiting example case of an excitation modality comprising pressure/thermal irradiance excitation, the pre-formed wrapper 10, the electronic assembly 20 and plate 26, e.g., a lid, may be positioned on top of the wrapper to be cured. These elements may be placed inside a vacuum bag to implement a vacuum packaging, which in turn may then be placed inside an oven to cure the first and/or second layers 12, 14 while plate 26, in response to the formed vacuum, effectively applies a compression force (schematically represented by arrows 28), which may be conducive to establish conformable adherence of the security wrapper with respect to circuit components 22. The foregoing description should be construed in an example sense and not in a limiting sense since other alternative implementations, such as based on positive pressure, could be used in lieu of a vacuum (based on negative pressure) for inducing the compression force.

Figure 4:
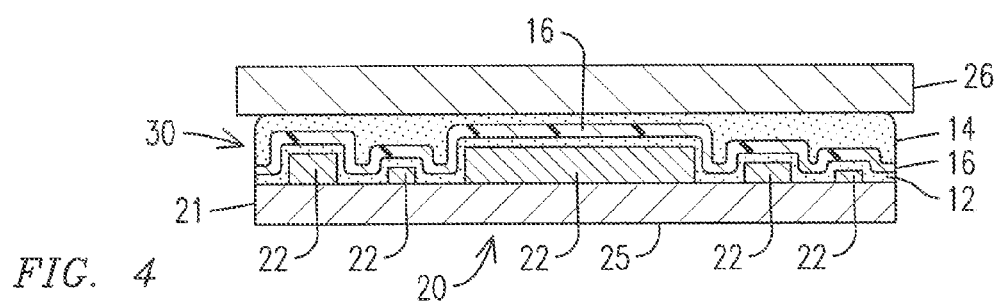

FIG. 4 illustrates a wrapper 30 in a cured condition where first and/or second wrap layers 12, 14 and flexible layer 16 conformably adhere with respect to circuit components 22. This conformable adherence may be achieved notwithstanding of substantial variation that may be present in the respective three-dimensional profiles of circuit components 22. The conformably adherence is arranged to effect a thermal coupling between first and/or second wrap layers 12, 14 and circuit components 22 to dissipate heat produced by circuit components 22. As a non-limiting example, in the case where first and second wrap layers 12, 14 comprise respective adhesive layers, such layers may be chosen from adhesives engineered for providing superior cohesive adhesion or bonding and also engineered for providing efficient thermal management. It will be further appreciated that a resulting profile of the wrapper 30 having this conformable adherence characteristics would be substantially less bulky (e.g., less voluminous) compared to prior art box-like enclosures for protecting the circuit components 22 of electronic assembly 20.

It will be appreciated that construction and/or assembly of the pre-formed wrapper 10, as conceptually illustrated in FIG. 1, may be performed at a first location, such as a site where a purveyor of pre-formed wrappers 10 may perform wrapper pre-forming operations. In one non-limiting embodiment, the pre-formed wrapper 10 may then be made available (e.g., shipped or otherwise purveyed by (or on behalf of) the purveyor of pre-formed wrappers 10 in an uncured condition inside an appropriate protective packaging to a remote location for processing at the remote location effective to form a security wrapper assembled onto an electronic assembly, such as described above in the context of FIGS. 2-4. In one non-limiting example, the remote location may be a site where a purveyor of electronic assemblies performs manufacturing operations in connection with such electronic assemblies.

FIGS. 5-9 depict a flow sequence of non-limiting operations illustrating details for forming a security wrapper that includes a pass-through, such as a thermal pass-through as may be used for transferring heat from circuit components of the electronic assembly that may produce an amount of heat in excess of a predefined threshold level, such as may be produced by a relatively hotter circuit component. As a non-limiting example, there may be situations where the thermal coupling provided by first and/or second wrap layers 12, 14 may not be sufficient to dissipate the excess heat produced by such relatively hotter circuit components. The description below will not repeat structural and/or operational relationships described above in connection with the first and second wrap layers and the interposed flexible layer. The description below will primarily focus on non-limiting actions for arranging such a thermal pass-through in a security wrapper.

Figure 5:
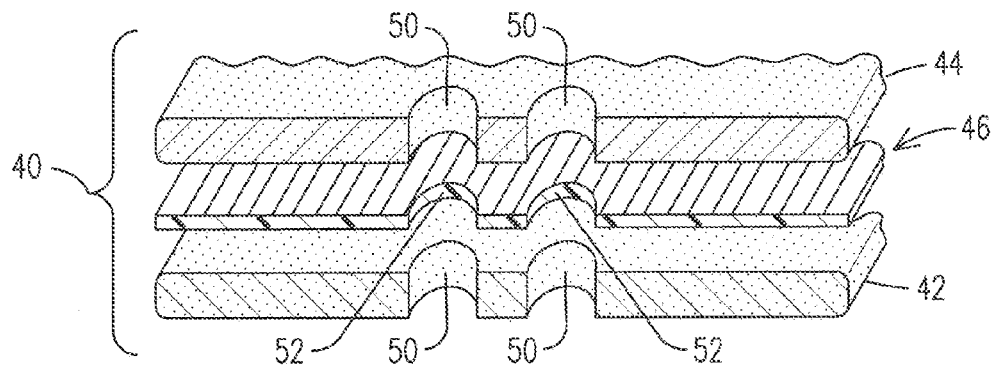
FIGS. 5-9 depict a flow sequence of non-limiting example operations illustrating further details for forming a security wrapper including a thermal pass-through, as may be used for transferring heat from a circuit component of the electronic assembly producing a predefined amount of heat, such as may be produced by a relatively hotter circuit component.

FIG. 5 illustrates a pre-formed wrapper 40 in an uncured condition. In order to arrange for such a thermal pass-through in a security wrapper, a first wrap layer 42 and a second wrap layer 44 may include one or more access openings 50 arranged to provide access to one or one more cutouts 52 that may be constructed in a flexible layer 46. It will be appreciated that the foregoing structural arrangement is described in the context of a thermal pass-through; it will be appreciated, however, that such openings and cutouts could be constructed to permit relatively tall circuit components to protrude beyond the outer periphery of the wrapper; or to permit access to certain limited portions of the electronic assembly.

Figure 6:
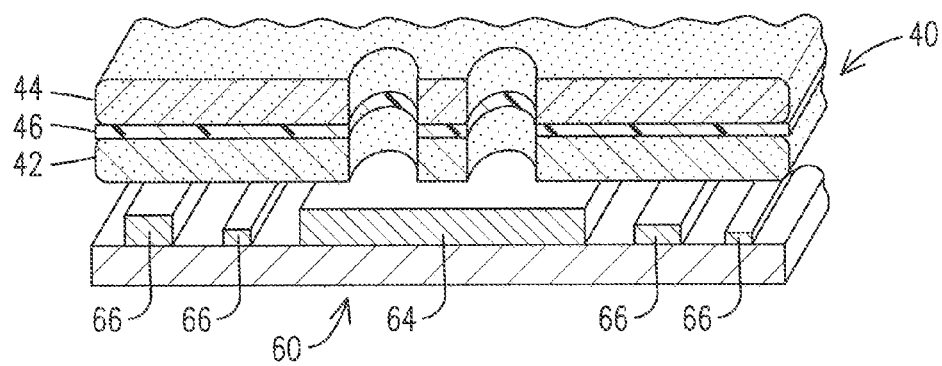

FIG. 6 illustrates an electronic assembly 60 including a plurality of circuit components 64 and 66. In this non-limiting example, circuit component 64 may represent a relatively hotter circuit component, which can benefit from a thermal pass-through.

Figure 7:
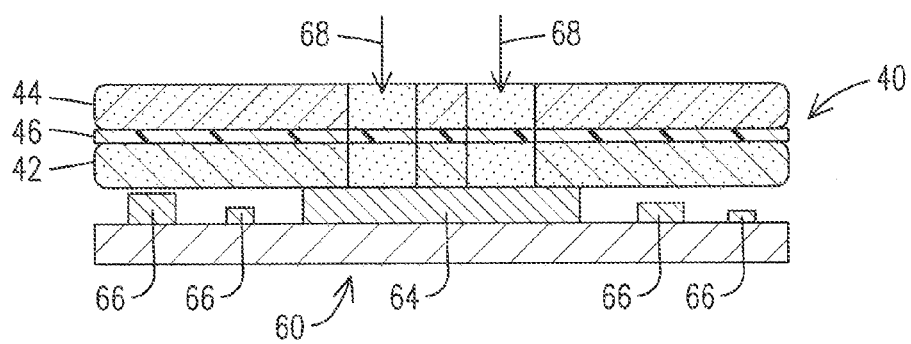
Figure 8:
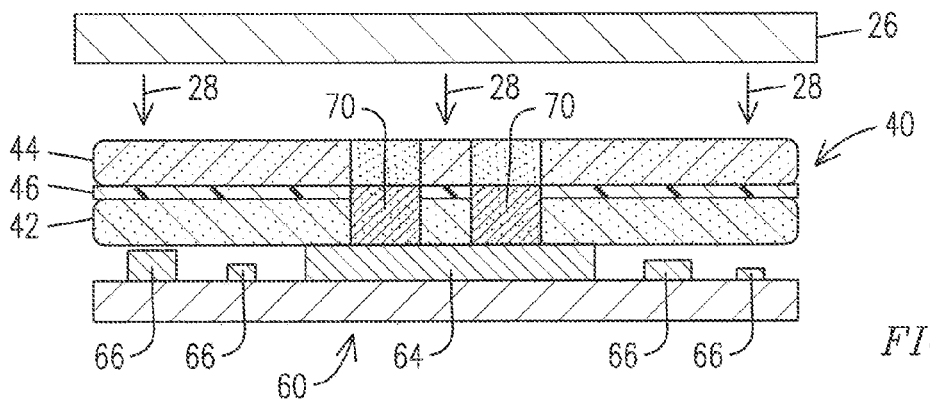

FIG. 7 illustrates a non-limiting example step for filling (conceptually represented by arrows 68) a predefined amount of a thermal interface material 70, such as a substantially thermally-conductive grease or gel (as seen in FIG. 8 upon completion of such injecting) to fill access openings 50 and cutouts 52.

FIG. 8 may be used for conceptualizing a process stage where the curing action may be performed for curing the pre-formed wrapper 40 while mounted onto electronic assembly 60. This stage is practically analogous to the description above in connection with FIG. 3.

Figure 9:
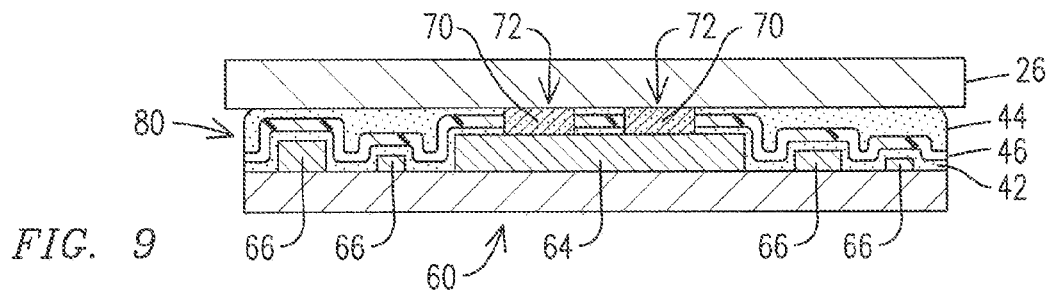

FIG. 9 illustrates a wrapper 80 in a cured condition where first and/or second wrap layers 42, 44 and flexible layer 46 conformably adhere with respect to circuit components 64 and 66. Wrapper 80 further includes a thermal pass-through 72 for transferring heat from relatively hotter circuit component 64, as may be carried to a heat spreader or heat sink.

Figure 10:
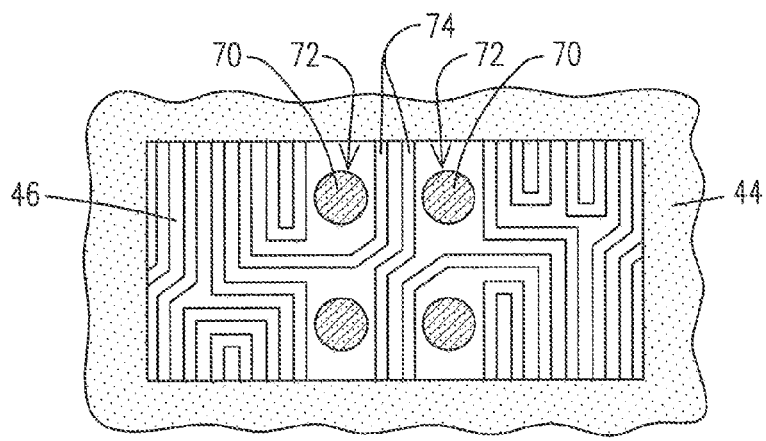

FIG. 10 is a top view of thermal pass-through 72 where it may be appreciated that at least some of the electrically conductive-traces in flexible layer 46 may be routed so that thermal pass-through 72 remains unobstructed so that thermal interface material 70 can efficiently transfer heat from circuit component 64.

Figure 11:
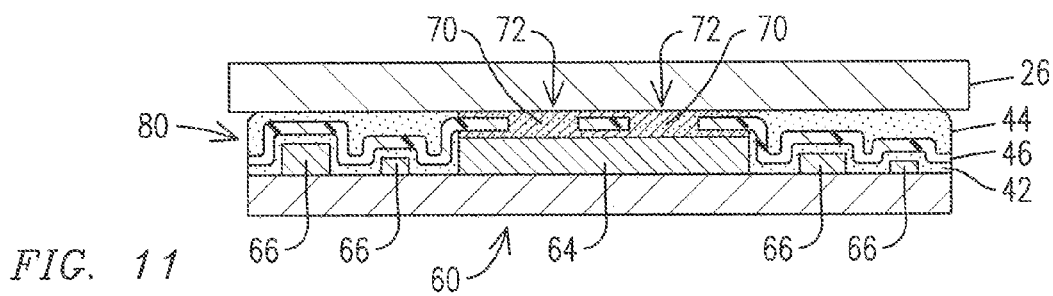
FIG. 11 illustrates an alternative embodiment where a window defined by a thermal pass-through may be constructed to extend practically over at least an entire hotter circuit component.

FIG. 11 illustrates an alternative embodiment where a window defined by thermal pass-through 72 may be constructed to extend practically over the entire area occupied by hot circuit component 64. That is, in this alternative embodiment, the first and second wrap layers 42, 44 may be constructed to be outside such a window. It will be appreciated that the thermal pass-through need not be limited to encompass just one circuit component since the size and location of the window may be chosen to span over multiple circuit components. The idea is to provide flexibility regarding a thermal pass-through having a window which may be customized over one or more circuit components for enhanced thermal management while maintaining an appropriate level of security.

Figure 12:
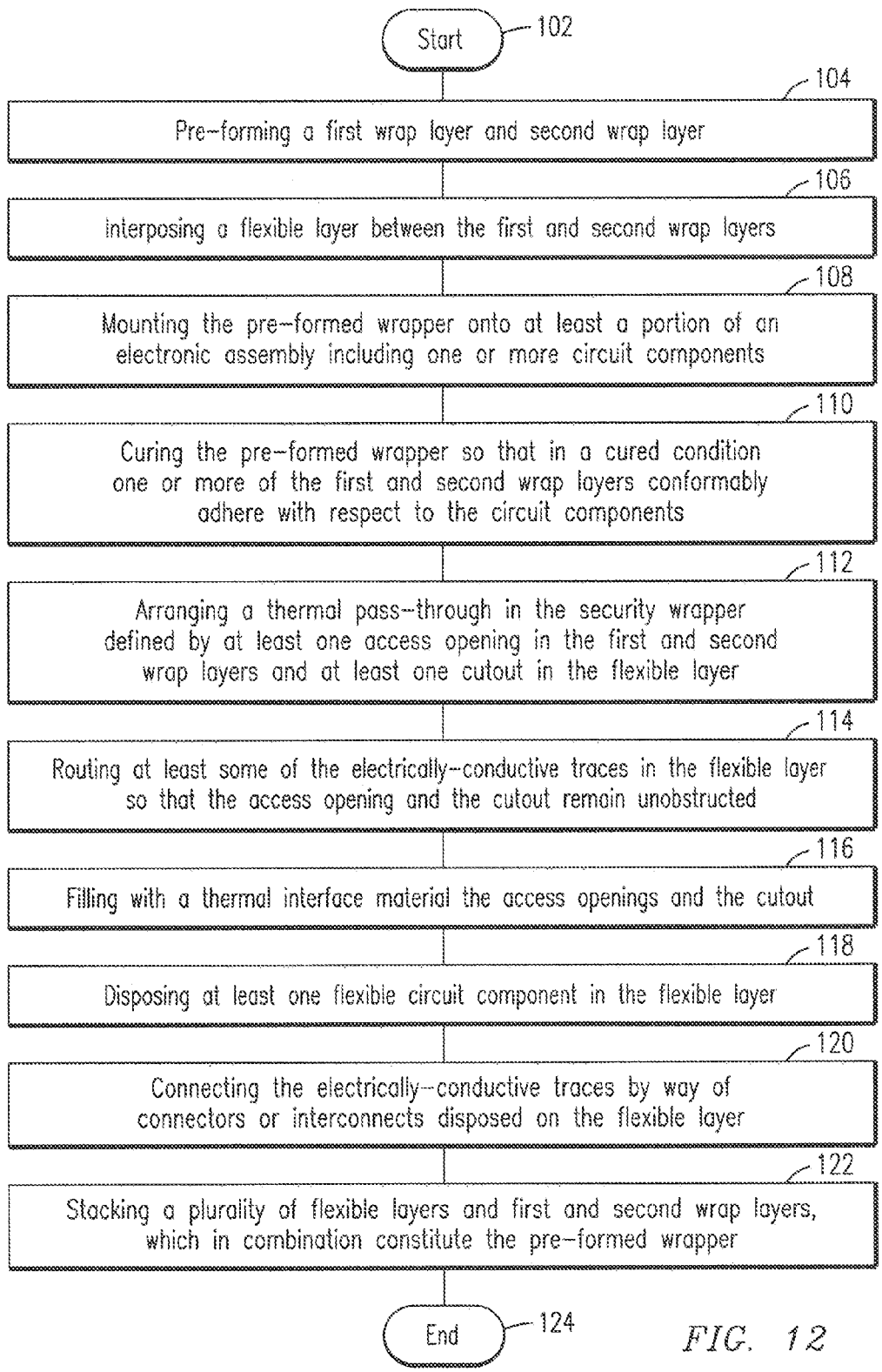
FIG. 12 is a flow chart of non-limiting steps in connection with one disclosed method for forming a security wrapper for an electronic assembly.

FIG. 12 is a flow chart of non-limiting steps in connection with one disclosed method for forming a security wrapper for an electronic assembly. Subsequent to a start step 102, step 104 allows pre-forming a first wrap layer and a second wrap layer, at least one of the first and second wrap layers comprises a curable adhesive material. Step 106 allows interposing a flexible layer between the first and second wrap layers, which in combination constitute a pre-formed wrapper in an uncured condition. The flexible layer may comprise a plurality of electrically-conductive traces. Step 108 allows mounting the pre-formed wrapper onto at least a portion of an electronic assembly including one or more circuit components having respective three-dimensional profiles which can vary over at least one surface of the electronic assembly. Step 110 allows curing the pre-formed wrapper under a predefined excitation modality so that in a cured condition the first and/or the second wrap layers conformably adhere with respect to the one or more circuit components, notwithstanding of variation in the respective three-dimensional profiles of the one or more circuit components. The conformably adhering effects a thermal coupling between at least one of the first and second wrap layers and the circuit components effective to dissipate heat produced by such circuit components. If so desired, step 112 allows arranging a thermal pass-through in the security wrapper in correspondence with one or more circuit components of the electronic assembly producing an amount of heat in excess of a predefined threshold level. The arranging of the thermal pass-through may involve defining at least one access opening in the first and second wrap layers and at least one cutout in the flexible layer accessible through the access openings. If so desired, step 114 allows routing at least some of the electrically conductive-traces in the flexible layer so that the access openings and the cutout remain unobstructed. Step 116 may allow filling with a thermal interface material the access openings and the cutout. If so desired, step 118 allows disposing at least one flexible circuit component in the flexible layer. The flexible circuit component may be an active circuit component, a passive circuit component or a combination of active and passive circuit components. Step 120 may allow connecting the electrically-conductive traces, such as by way of connectors or interconnects disposed on the flexible layer to provide respective electrical connections to the one or more circuit components in the electronic assembly. In one non-limiting embodiment, prior to an end step 124, step 122 may allow stacking a plurality of flexible layers and first and second wrap layers, which in combination constitute the pre-formed wrapper.

Figure 13:
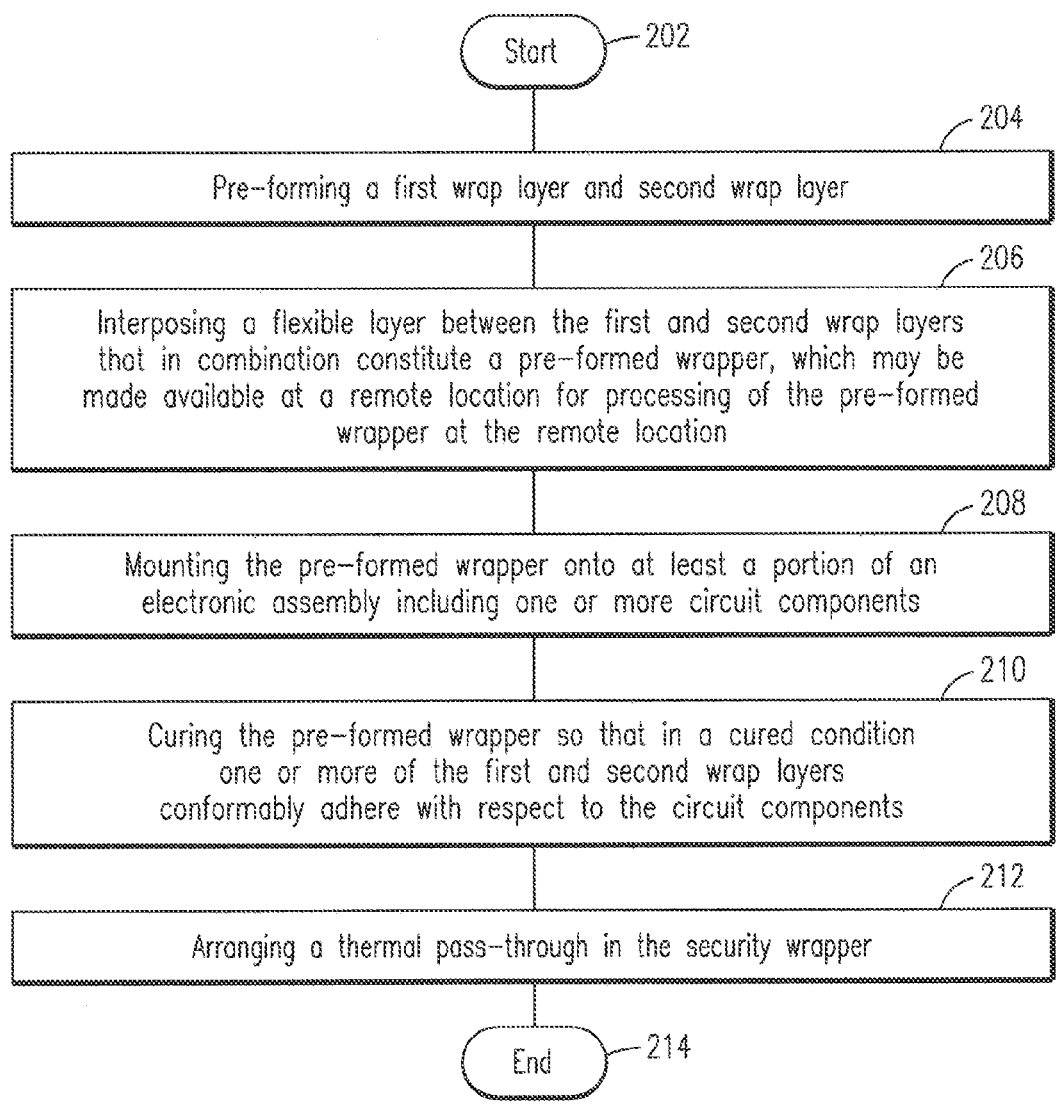
FIG. 13 is a flow chart of non-limiting steps in connection with another disclosed method for forming a security wrapper for an electronic assembly.

FIG. 13 is a flow chart of non-limiting steps in connection with another disclosed method for forming a security wrapper for an electronic assembly. Subsequent to a start step 202, step 204 allows pre-forming a first wrap layer and a second wrap layer, at least one of the first and second wrap layers comprises a curable adhesive material. Step 206 allows interposing a flexible layer between the first and second wrap layers, which in combination constitute a pre-formed wrapper in an uncured condition. The flexible layer comprises a plurality of electrically conductive-traces. The pre-formed wrapper may then be transferred (e.g., made available) to a remote location for processing of the pre-formed wrapper at the remote location effective to form a security wrapper assembled onto an electronic assembly. In one one-non-limiting embodiment, the foregoing steps may be performed at a first location, such as a site where a purveyor of pre-formed wrappers may perform wrapper pre-forming operations. The remote location may be a site where a purveyor of electronic assemblies performs manufacturing operations in connection with such electronic assemblies. Non-limiting steps that may be performed at the remote location may be as follows: Step 208 may allow mounting the pre-formed wrapper onto at least a portion of an electronic assembly including one or more circuit components having respective three-dimensional profiles which can vary over at least one surface of the electronic assembly. Step 110 may allow curing the pre-formed wrapper under a predefined excitation modality so that in a cured condition the at least one of the first and second wrap layers conformably adhere with respect to the one or more circuit components, notwithstanding of variation in the respective three-dimensional profiles of the one or more circuit components. If so desired, prior to an end step 214, step 212 may allow arranging a thermal pass-through in the security wrapper in correspondence with one or more circuit components of the electronic assembly producing an amount of heat in excess of a predefined threshold level.

As a non-limiting example, the methods disclosed with respect to FIGS. 12 and 13 may be individually implemented with an automated system. Though not illustrated, more specifically the steps disclosed may be performed by an automated system, such as, but not limited to, a robotic system, where a processor is provided to initiate, control any apparatus provided to perform a function, and/or evaluate when each step is completed. As a non-limiting example with respect to FIG. 12, the processor of the automated system may control an apparatus of the automated system, such as, but not limited to, a robotic apparatus, to pre-form a first wrap layer and a second wrap layer, at least one of the first and second wrap layers comprising a curable adhesive material. Likewise, the processor may control the automated system to interpose a flexible layer between the first and second wrap layers, which in combination constitute a pre-formed wrapper in an uncured condition with the flexible layer comprising a plurality of electrically-conductive traces. The processor may control the automated system to mount the pre-formed wrapper onto at least a portion of an electronic assembly including one or more circuit components having respective three-dimensional profiles which can vary over at least one surface of the electronic assembly may be controlled by the processor. The processor may control the automated system to cure the pre-formed wrapper under a predefined excitation modality so that in a cured condition at least one of the first and second wrap layers conformably adhering with respect to one or more circuit components, notwithstanding of variation in the respective three-dimensional profiles of one or more circuit components.

While various disclosed embodiments have been described above, it should be understood that they have been presented by way of example only, and not limitation. Numerous changes to the subject matter disclosed herein can be made in accordance with the embodiments disclosed herein without departing from the spirit or scope of the embodiments. In addition, while a particular feature may have been disclosed with respect to only one of several implementations, such feature may be combined with one or more other features of the other implementations as may be desired and advantageous for any given or particular application.

Therefore, the breadth and scope of the subject matter provided herein should not be limited by any of the above explicitly described embodiments. Rather, the scope of the embodiments should be defined in accordance with the following claims and their equivalents.

The terminology used herein is for the purpose of describing particular embodiments only and is not intended to be limiting. As used herein, the singular forms "a." "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Thus, while embodiments have been described with reference to various embodiments, it will be understood by those skilled in the art that various changes, omissions and/or additions may be made and equivalents may be substituted for elements thereof without departing from the spirit and scope of the embodiments. In addition, many modifications may be made to adapt a particular situation or material to the teachings of the embodiments without departing from the scope thereof. Therefore, it is intended that the embodiments not be limited to the particular embodiment disclosed as the best mode contemplated, but that all embodiments falling within the scope of the appended claims are considered.

We claim:

1. A security wrapper for an electronic assembly, comprising:
    a first pre-formed and curable wrap layer and a second pre-formed and curable wrap layer, at least one of the first and second curable wrap layers comprising a curable adhesive material;
    a flexible layer interposed between the first and second pre-formed and curable wrap layers to form a pre-formed uncured wrapper, the flexible layer comprising one or more electrically-conductive traces, wherein said at least one of the first and second pre-formed and curable wrap layers is structurally arranged to provide in a cured condition conformable adherence with respect to one or more circuit components disposed in the electronic assembly, wherein the conformable adherence provided by said at least one of the first and second wrap layers effects a thermal coupling with the one or more circuit components effective to dissipate heat produced by said one or more circuit components; and
    a plate disposed above the first and second wrap layers to apply a compression force to the first and second wrap layers to establish conformal adherence during curing.

2. The security wrapper of claim 1, further comprising a thermal pass-through arranged in correspondence with a circuit component of the electronic assembly producing an amount of heat in excess of a predefined threshold level.

3. The security wrapper of claim 1, wherein said at least one of the first and second wrap layers is selected from the group consisting of a thermoplastic adhesive, a thermoset adhesive, a B-stage adhesive, a phenolic adhesive and an epoxy, and further wherein the electrically-conductive traces are selected from the group consisting of metal traces, carbon nanotubes, electrically-conductive polymers, thin films composed of indium tin oxide and electrically-conductive inorganic material.

4. The security wrapper of claim 1, wherein the flexible layer includes a plurality of perforations arranged to increase cohesion between the first and second wrap layers.

5. A security wrapper for an electronic assembly having a plurality of circuit components with three-dimensional profiles and a circuit board, comprising:
    a first curable wrap layer and a second curable wrap layer having a geometric configuration of a layout of the electronic assembly, at least one of the first and second curable wrap layers comprising a curable adhesive material; and
    a flexible layer interposed between the first and second curable wrap layers, which in combination constitute an uncured pre-formed wrapper in an uncured condition that is curable at a predefined excitation modality while mounted onto the at least a portion of the electronic assembly to wrap the electronic assembly and form the security wrapper so that in a cured condition the security wrapper conformably adheres to the three-dimensional profiles of the plurality of circuit components and the circuit board, notwithstanding of variation in the three-dimensional profiles wherein a plate disposed above the first and second wrap layers to apply a compression force to the first and second wrap layers to establish conformal adherence during curing.

6. The security wrapper of claim 5, wherein the flexible layer comprises one or more electrically conductive-traces, and wherein the curable pre-formed wrapper is transferred to a remote location for curing of the curable pre-formed wrapper at the remote location effective to form the security wrapper assembled onto the electronic assembly.

7. The security wrapper of claim 5, wherein the at least first and second wrap layers conformably adhere to effect a thermal coupling between said at least one of the first and second wrap layers and the plurality of circuit components effective to dissipate heat produced by the plurality of circuit components.

8. The security wrapper of claim 5, further comprising a thermal pass-through in correspondence with one or more circuit components of the electronic assembly to produce an amount of heat in excess of a predefined threshold level.

9. The security wrapper of claim 5, wherein the flexible layer includes a plurality of perforations arranged to increase cohesion between the first and second wrap layers.

10. A system, comprising:
    a pre-formed first wrap layer and a pre-formed second wrap layer, at least one of the first and second wrap layers comprising a curable adhesive material;
    a flexible layer interposed between the first and second pre-formed wrap layers, which in combination constitute an uncured pre-formed wrapper in an uncured condition, the flexible layer comprising one or more electrically-conductive traces;
    an electronic assembly including one or more circuit components having respective three-dimensional profiles which can vary over at least one surface of the electronic assembly; and
    a plate serving as a lid disposed above the first and second wrap layers to apply a compression force to the first and second wrap layers to establish conformal adherence of the at least one of the first and second wrap layers with respect to the one or more circuit components;
    wherein the uncured pre-formed wrapper is mounted onto at least a portion of the electronic assembly; and
    wherein the pre-formed wrapper, while mounted onto the at least a portion of the electronic assembly, is curable under a predefined excitation modality so that in a cured condition the first and second wrap layers conformably adheres with respect to said one or more circuit components, notwithstanding of variation in the respective three-dimensional profiles of said one or more circuit components.

11. The system of claim 10, wherein the at least one of the first and second wrap layers effect a thermal coupling between said at least one of the first and second wrap layers and said one or more circuit components effective to dissipate heat produced by said one or more circuit components when conformably adhered.

12. The system of claim 10, wherein one of the first wrap layer or the second wrap layer comprises a material selected from the group consisting of a thermal interface material, a gap filler material and a curable adhesive material.

13. The system of claim 10, further comprising a thermal pass-through in correspondence with one or more of the circuit components of the electronic assembly producing an amount of heat in excess of a predefined threshold level.

14. The system of claim 13, wherein the thermal pass-through comprises a defined at least one access opening in the first and second wrap layers and at least one cutout in the flexible layer accessible through the access openings.

15. The system of claim 14, wherein at least some of the electrically-conductive traces in the flexibly layer are routed to provide for the access openings and the cutout remains unobstructed.

16. The system of claim 14, wherein a thermal interface material fills the access openings and the cutout.

17. The system of claim 10, wherein said at least one flexible circuit component comprises a circuit component selected from the group consisting of an active circuit component, a passive circuit component and a combination of active and passive circuit components.

18. The system of claim 10, wherein the electrically conductive-traces are connected by way of connectors or interconnects disposed on the flexible layer to provide respective electrical connections to the one or more circuit components in the electronic assembly.

\* \* \* \* \*